United States Patent [19]

Wilson et al.

[11] 4,371,832

[45] Feb. 1, 1983

[54] DC GROUND FAULT DETECTOR WHEREIN FAULT IS SENSED BY NOTING IMBALANCE OF MAGNETIC FLUX IN A MAGNETIC CORE

[76] Inventors: Gerald L. Wilson, 29 Highgate Rd., Wayland, Mass. 01778; David Otten, 50 Playstead Rd., Newton, Mass. 02158

[21] Appl. No.: 153,710

[22] Filed: May 27, 1980

[51] Int. Cl.³ ............... G01R 31/02; G01R 19/10; G01R 33/00
[52] U.S. Cl. .................. 324/51; 324/117 R; 340/651
[58] Field of Search .............. 324/51, 117 R, 127, 324/133, 253; 361/45, 87; 340/651

[56] References Cited
U.S. PATENT DOCUMENTS

| | | | |
|---|---|---|---|
| 3,353,065 | 11/1967 | Bassani | 340/651 X |
| 3,422,352 | 1/1969 | Paulkovich | 324/117 R X |
| 3,548,259 | 12/1970 | McDonald | 361/45 |
| 3,611,038 | 10/1971 | Benham | 361/45 |
| 3,662,218 | 5/1972 | Whitlow | 361/45 |
| 3,671,809 | 6/1972 | Ryan et al. | 340/651 X |
| 3,768,011 | 10/1973 | Swain | 324/253 X |
| 3,801,871 | 4/1974 | Loh | 361/45 |
| 3,996,513 | 12/1976 | Butler | 324/51 X |
| 4,011,507 | 3/1977 | Rossell | 324/51 X |
| 4,021,729 | 5/1977 | Hudson | 324/117 R X |
| 4,118,597 | 10/1978 | Proctor et al. | 324/117 R X |
| 4,188,574 | 2/1980 | Allington | 324/51 |
| 4,276,510 | 6/1981 | Tompkins et al. | 324/117 R X |
| 4,293,813 | 10/1981 | Groenenboom | 324/117 R |

*Primary Examiner*—Gerard R. Strecker
*Attorney, Agent, or Firm*—Robert Shaw

[57] ABSTRACT

A dc ground fault detector in which ground fault is sensed by noting an imbalance of magnetic flux due to a pair of windings on a toroidal core.

24 Claims, 6 Drawing Figures

DC GROUND FAULT DETECTOR WHEREIN FAULT IS SENSED BY NOTING IMBALANCE OF MAGNETIC FLUX IN A MAGNETIC CORE

The present invention relates to dc ground-fault detectors.

The context in which the present invention is discussed is that of dc control power systems in power generating plants. These systems are composed of batteries which are connected to provide +125 volts dc and −125 volts dc and are maintained in a fully charged condition.

Typically a system to provide control power in such a plant includes hundreds of devices fed from a multiplicity of buses involving hundreds of miles of cable. Since the power supply to the system consists of two dc sources of opposite polarity relative to ground, the effect of a failure of insulation between the applied potential and ground with respect to any device leads to a flow of ground current. If a similar insulation failure between the opposite polarity and ground also occurs, a short circuit across the full power supply could eventually evolve. Since the dc power source supplies all of the control power of the plant, the integrity of the supply is critical. Devices exist which indicate failure of the entire insulation system. However, locating the fault often involves manual isolation of the system buses and feeds individually until the cable or device that has an insulation failure has been localized. A dc ground fault detector that is inexpensive and that can be placed on each cable or group of cables feeding a portion of the plant control power system will enable the fault location to be more quickly identified, will reduce the time of exposure of the system to a potential catastrophic second ground fault of the opposite polarity, and will reduce the human hazard of identifying fault location manually while the system is energized.

Accordingly, it is a principle object of the present invention to provide a dc fault detector, one which is economical to fabricate, reliable, and easy to install.

These and still further objects are addressed hereinafter.

The foregoing objects are achieved, generally, in a ground fault detector and the like that includes a high permeability toroidal core (or the like) having a square hysteresis loop. There are three windings wound about the toroid in a solenoidal configuration. Two of the three windings have an equal number of turns and, when energized, have an electric current flow therethrough such that the magnetomotive force within the toroidal core because of one of the two windings opposes (i.e., bucks) the magnetomotive force within the toroidal core because of the other of the two windings. The two windings, in an operating system, are connected in series with a load to be monitored, the load being connected serially between the two windings. A difference between the currents in the two windings shows the existence of a ground fault, said difference being the ground current at the fault. Sensing means is provided to note any such difference in electric current flow in the two windings. The sensing means includes a voltage source and series resistor connected across the third of the three windings; the polarity of the voltage applied by the voltage source to the third winding and series resistor is reversed every time the current in the third winding reaches a predetermined amplitude. Means is provided to determine the duty cycle of the voltage applied to the third winding and to relate that duty cycle to any fault current in the portion of the system supplied through the aforementioned two windings.

The invention is hereinafter discussed with reference to the accompanying drawing in which.

Figure 1:
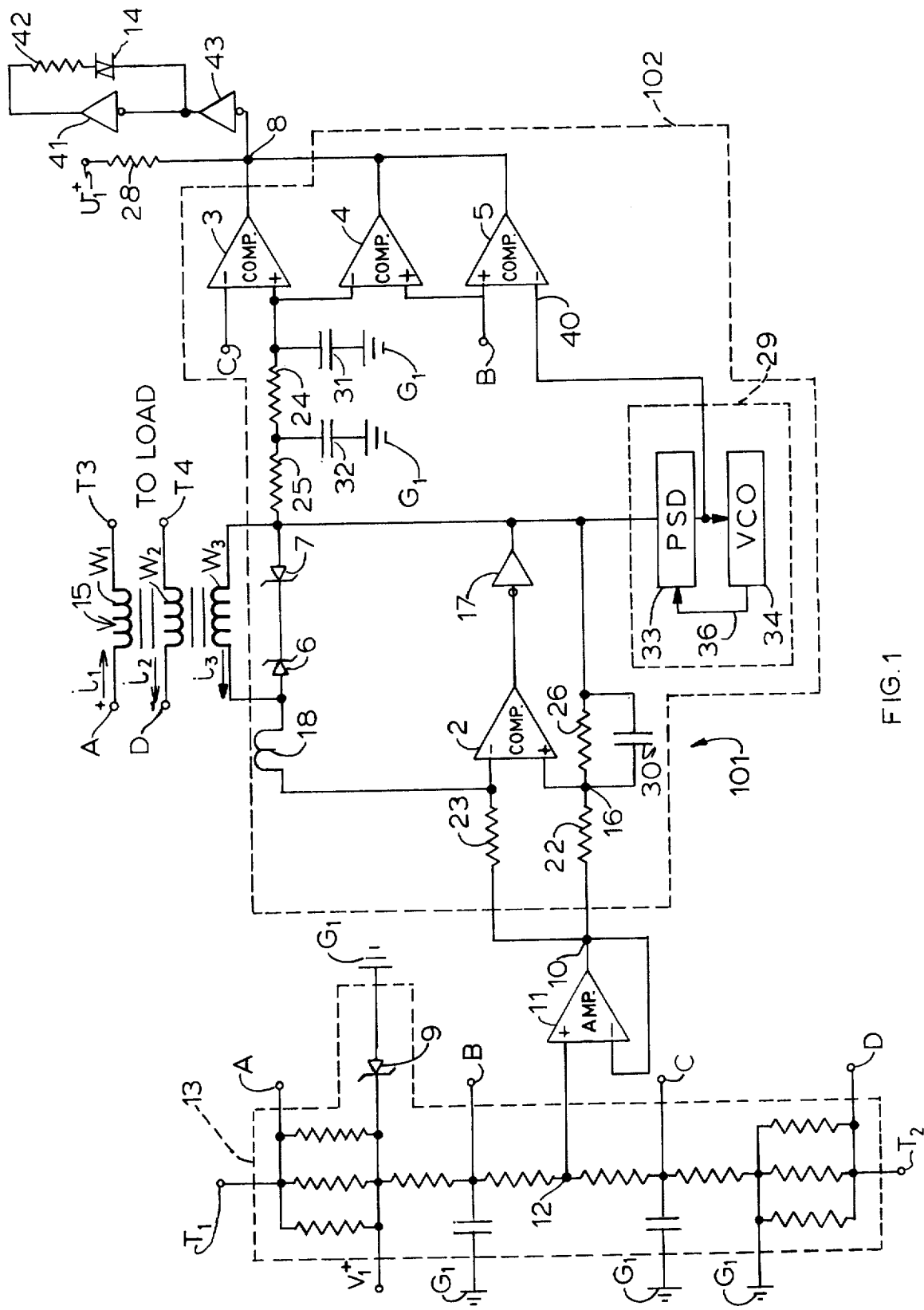
FIG. 1 is a diagrammatic representation of a dc gound fault detector embodying the present invention concepts.
Figure 2:
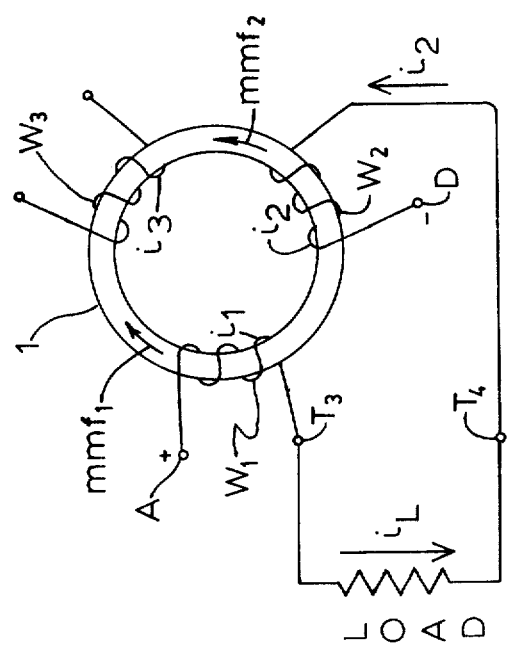
FIG. 2 is a top view of a toroidal magnetic core showing three windings wound thereon.

Turning now to FIG. 1, there is shown diagrammatically at 101 a ground fault detector for sensing ground faults in a dc system. The detector 101 includes a high permeability toroidal core 1 (see FIG. 2) having a square hysteresis loop (see FIGS. 4A and 4B hereof). There are three windings $W_1$, $W_2$ and $W_3$ wound about the toroid in a solenoidal configuration to form a coil and core combination 15 which is a differential transformer. Two of the windings, $W_1$ and $W_2$, have an equal number of turns to receive a dc applied voltage between terminals A and D. A load (in FIG. 2) to be monitored for ground faults is connected between the terminals $T_3$ and $T_4$. Electric current flow in the detection circuitry is, then, from the terminal A, through the winding $W_1$ (i.e., current $i_1$ in FIG. 1), through the load L (i.e., current $i_L$ in FIG. 2) and thence the winding $W_2$ (i.e., current $i_2$ in FIG. 1) to the terminal D. In the actual device, the winding $W_1$ is wound about the winding $W_2$ (i.e., the winding $W_2$ is within the winding $W_1$) in a nested arrangement. The current flow in the winding $W_1$ is in a direction to create a circumferential magnetomotive force (i.e., $mmf_1$) which, when $i_1$ equals $i_2$, is equal and opposite (i.e., bucking) to the magnetomotive force created by the winding $W_2$ (i.e., $mmf_2$). (The ampere turns in the winding $W_1$ equal the ampere turns in the winding $W_2$.) In the device 101, any differential between $mmf_1$ and $mmf_2$ is noted and is related to any leakage or ground fault current in the load L. In the situation in which no such leakage occurs $i_1 = i_2$ (and $i_1 = i_2 = 1_L$ in FIG. 2). With reference to FIG. 1, the voltage applied to the terminals A and D of the coil and core combination 15 is that applied to terminals $T_1$ and $T_2$ of the detector 101. Most of the remaining circuitry serves to detect the relationship between the magnitudes of the currents $i_1$ and $i_2$ in the windings $W_1$ and $W_2$, respectively, as now explained.

The relationship between the currents $i_1$ and $i_2$ is sensed by noting the effect thereof on the third winding $W_3$. The differential transformer 15 is particularly adapted to function in a dc current mode. The windings $W_1$ and $W_2$ carry dc load current. The core 1, as previously indicated, is chosen to have high permeability and a strong nonlinear characteristic. Thus, the magnetizing effect of any unbalance between $i_1$ and $i_2$ is exaggerated in the core 1. The winding $W_3$ is a low-current tickler coil.

Figure 3:
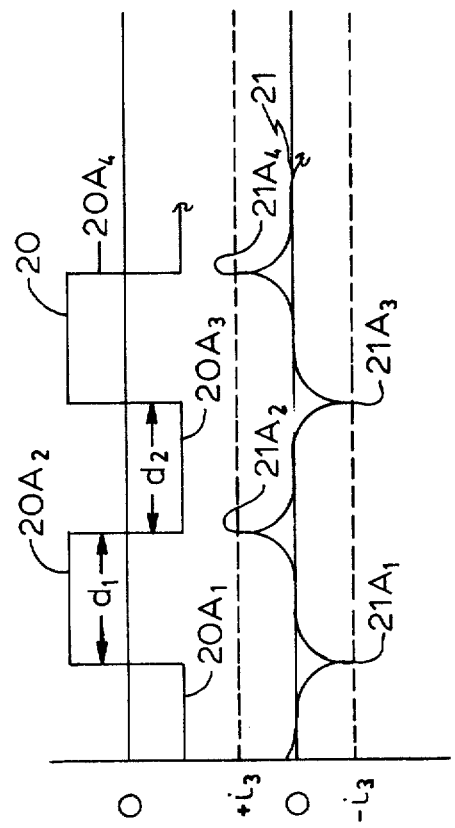
FIG. 3 is a graph of voltage v. time of a voltage source and current v. time in winding $W_3$ in FIG. 2.

The tickler coil $W_3$ is connected in series with an inductance 18 and a resistor 23. The series combination is driven between the output of an inverter 17 (which performs a buffer function) and a point 10 in FIG. 1, with a variable-duty-cycle voltage square wave of the type shown at 20 in FIG. 3. When the current in the tickler coil $W_3$ reaches a pre-set value (either of the values designated $+i$ and $-i$ in FIG. 3) corresponding to mild saturation of the core 1, the polarity of the square wave 20 is reversed; reversal is effected by a comparator 2 which detects threshold values $+i$ and $-i$ by measuring the voltage across the resistor 23 and reversing the applied voltage of FIG. 3 whenever either threshold is reached. When the core is driven in the opposite direction and the current in the tickler coil $W_3$ reaches the pre-set value of opposite polarity the square wave 20 is reversed back to the original polarity. If there is no net dc flux from the high-current windings $W_1$ and $W_2$ (i.e., the current in one winding is equal to the current in the other winding), the voltage square wave 20 driving the tickler coil $W_3$ will be symmetric. If there is a net dc flux from the high current windings $W_1$ and $W_2$, resulting in saturation of the core, it will take longer for the tickler current 21 in FIG. 3 to reach the pre-set value in one direction and less time for it to reach it in the other direction. Over a limited range, the duty cycle ($d_1/d_1 + d_2$, wherein $d_1$ is the width of positive voltage pulses $20A_2$, $20A_4$–in FIG. 3 and $d_2$ is the width of negative pulses $20A_1$, $20A_3$–) of the tickler voltage 20 will be proportional to the difference in dc current in the high current windings $W_1$ and $W_2$, as now discussed.

Figure 4A:
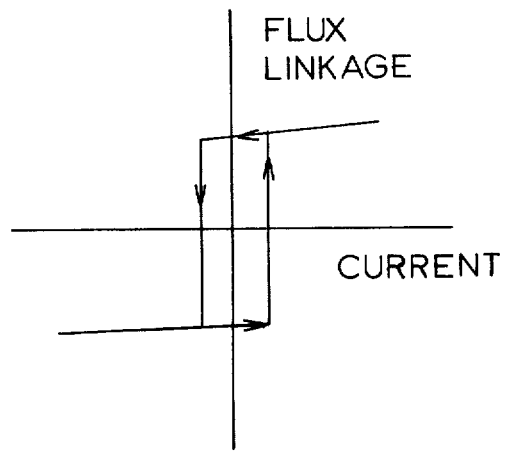
FIG. 4A and 4B are graphs of flux linkage v. current in the same winding as represented by the graphs in FIG. 3.
Figure 4B:
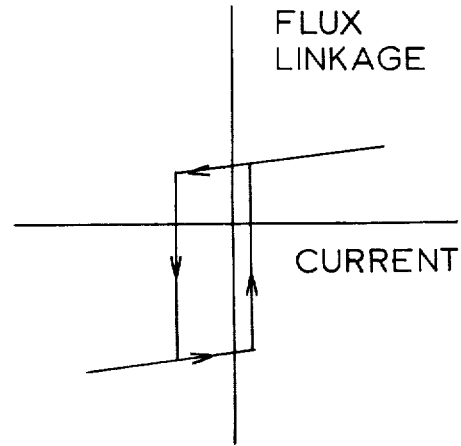

The unbalance just referred to is caused by the effect of a net flux produced in the core 1 due to unequal currents in the windings $W_1$ and $W_2$. This shifts the flux-linkage characteristic of the core as viewed from winding $W_3$ from that having a symmetrical characteristic as shown in FIG. 4A to one having an unsymmetrical characteristic as shown in FIG. 4B. When the symmetrically excited core is energized by the square wave voltage source, the current waveform 21 is symmetrical. However, when the unsymmetrical characteristic is energized by the source, the current tends to have a negative average value. In the absence of the resistor 23, the actual current waveform would have no average value. However, the presence of the resistor 23 reduces the voltage across winding $W_3$ to be the difference between the zero point at 10 and the voltage drop across the resistor 23. Since the current through the resistor 23 tends to be unsymmetrical for the characteristic of FIG. 4B, the voltage and therefore the flux linkage across winding $W_3$ is unsymmetrical. As a result, the time for the flux to drive the current from a negative peak value $21A_1$, $21A_3$–to a positive peak value $21A_2$, $21A_4$–is longer than the time to drive the current from the positive peak value back to the negative peak value; an opposite polarity fault will shift the flux-linkage characteristic to the right rather than to the left as in FIG. 4B.

Thus, in the event of a ground fault, the time lapse between current peaks $21A_1$ and $21A_3$–will either increase or decrease, depending on the polarity of the fault, with a respective decrease or increase between $21A_2$ and $21A_3$–Hence, there is a change in the duty cycle $d_1/d_1 + d_2$ as well as the ratio $d_1/d_2$ and either can be used to detect a fault. It is noted later, however, that large fault current results in a change (here a decrease) in the frequency of the current wave 21. Some discussion of the circuit elements to achieve the foregoing now follows.

The voltage across the resistor 23, as above indicated, is sensed by the comparator 2 which determines differences in electric potential between the circuit point 10 in FIG. 1 and the midpoint shown at 16 of a voltage divider formed by resistors 22 and 26. The voltage across the resistor 23 is proportional to the current $i_3$; hence that voltage can be and is used to note the thresholds $+i$ and $-i$ in FIG. 3. A speed-up capacitor 30 eliminates high-frequency oscillations during polarity reversal of the voltage wave 20. The output of the inverter-buffer 17 is filtered by a two-pole low pass RC filter consisting of resistors 24 and 25 and capacitors 31 and 32, to determine the dc value of the variable-duty-cycle, square wave 20. Comparators 3 and 4 compare that dc value with reference set-point voltages at C and B from a voltage divider 13. The comparators 3 and 4 are connected in an OR configuration and are used to drive two inverters or buffers 41 and 43 which drive the LED 14. If both outputs of the comparators 3 and 4 are high, the LED 14 emits green light but, if either is low, the LED 14 emits red light. Resistor 28 is a pullup resistor for the outputs of the comparators 3, 4 and 5.

If the difference in the dc current (i.e., $i_1 - i_2$) is very large, the core 1 will be heavily saturated and appear as a short circuit to the tickler signal. As the core becomes more saturated, the frequency of the tickler coil voltage waveform 20 becomes higher. To limit this frequency to the range where all the circuit components operate normally, a small inductance (i.e., the inductance 18) is inserted in series with the tickler coil.

The frequency of the square wave 20 applied to the tickler coil $W_3$ is measured by a phase locked loop 29 (in the analyzing circuit 102) which contains a voltage controlled oscillator (VCO) 34 and phase sensitive detector 33. The input to the VCO signal at 40 is proportional to the frequency of the square wave 20; that input is compared by the comparator 5 against the set-point B. The phase-sensitive detector (PSD) 33 whose input is the voltage wave 20 from the inverter buffer 17 provides a control input to the VCO 34. A feedback signal from the VCO 34 to the PSD 33 is provided along conductor 36. The comparator 5 is also in an OR configuration with the comparators 3 and 4 and its output must also be high for the LED 14 to emit green light. In this way, frequency (or period) as well as duty cycle, is employed to denote presence or absence of ground fault.

The circuitry in FIG. 1 is powered by the voltage divider 13 having input terminals $T_1$ and $T_2$; the terminal $T_1$ received a plus dc voltage ($+125$ volts in an actual device) and the terminal $T_2$ receives a minus dc voltage ($-125$ volts in the actual device). The circuit point labeled 12 is a zero point and it is connected through an operational amplifier 11 which serves as a buffer whose output at 10 provides the detector ground, that is, the output 10 is the voltage level used as a standard level or magnitude against which other voltage levels in the detecting circuitry to the right of 10 in FIG. 1 are compared. The designation $G_1$ in FIG. 1 indicates common electrical connections in the detector 101. It is not believed that the resistors and capacitors that form the voltage divider 13 need be discussed further since the functions thereof are known. Outputs from the voltage divider 13 are at A,B,C,D and $v_1+$. The connections between the outputs A,B,–and other elements in the circuits of FIG. 1 are indicated by the corresponding designation at the input to the particular element. The level of $v_1+$ is maintained by a zener diode 9. The two back-to-back zener diodes 6 and 7 prevent noise spikes from damaging the input to the comparator 2.

Figure 5:
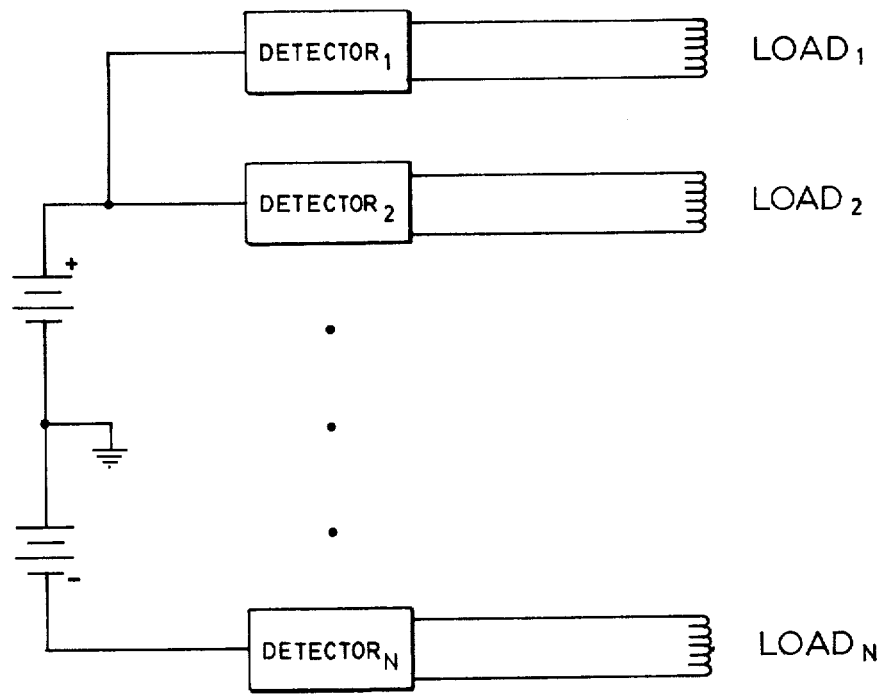
FIG. 5 shows diagrammatically a portion of a dc power control system that includes a plurality of dc ground fault detectors of the type shown diagrammatically in FIG. 1.

The system shown in FIG. 5 includes N detectors, like the detector 101, to monitor N loads. A red light output by any one of the N detectors indicates the presence of fault current at the portion of the system monitored by that particular detector.

Modifications of the invention herein disclosed will occur to persons skilled in the art and all such modifications are deemed to be within the scope of the invention as defined by the appended claims.

What is claimed is:

1. A dc ground fault detector that comprises a high permeability toroidal core having a square hysteresis loop; three windings wound about the toroid in a solenoidal configuration, two of the windings having an equal number of turns; means for introducing an electric current into one of the two windings, which current, in a normally operating detector, flows through to a load whose ground condition is to be sensed and then to the other of the two windings, the current in one of the two windings being caused to flow in a direction that produces a magnetomotive force opposite to the direction of the magnetomotive force of the other winding of the two windings; sensing means operable to determine any difference between the currents in the two windings, which difference drives the core into saturation, said sensing means comprising a voltage source and series resistor connected across the third of the three windings, said sensing means further including means to reverse the polarity of the voltage applied by the voltage source every time current through the third winding reaches a predetermined value, there being an increase in the frequency of the voltage as the core becomes more saturated; and measuring means connected to the voltage surce and operable to measure the frequency of the voltage applied to the third winding and operable to relate the frequency to the presence or absence of ground fault.

2. A ground fault detector as claimed in claim 1 wherein the measuring means includes means to measure the duty cycle of the voltage, which duty cycle, when about fifty percent, indicates currents in said two windings are equal, which means to measure the duty cycle comprises the combination of a low pass filter and a comparator connected to receive as input the voltage of the voltage source, the comparator being set to give an indication when the ground current exceeds a predetermined value and hence the duty cycle varies from said fifty percent by a predetermined value.

3. A ground fault detector as claimed in claim 1 which is operable to prevent the ill effects on the sensing circuit of high ground currents, that comprises a small fixed indicator connected in series with the third winding, the series resistor and the voltage source, said measuring means comprising a high frequency detector circuit connected to the voltage source to receive the same voltage that is applied to the third winding and provide an output, a comparator connected to receive as one input thereto the output of the high frequency detector circuit and operable to sense when frequency of the voltage is above a certain value to indicate heavy fault current.

4. A ground fault detector as defined by claim 1 wherein dc electric power to energize the sensing means and the third winding comes from the same power source as that which energizes said two windings.

5. A ground fault detector as defined by claim 4 that includes a resistive divider to receive the dc electric power and operable to render that dc electric power appropriate for the sensing means and the third winding.

6. A ground fault detector as defined by claim 2 that includes an LED that emits electromagnetic radiation to indicate absence of ground fault and different electromagnetic radiation to indicate presence of ground fault.

7. A ground fault detector as defined by claim 6 having a plurality of comparators connected in an OR configuration as input to the LED.

8. A dc ground fault device that comprises a high permeability core having a square hysteresis loop; three windings wound on the core in solenoidal configurations, two of the windings being adapted to carry load current and having an equal number of turns, the current in one of the two windings being caused to flow in a direction that produces a magnetomotive force opposite to the direction of the magnetomotive force of the other of the two windings; sensing means operable to determine any difference between the currents in the two windings, which difference drives the core into saturation, said sensing means comprising a voltage source and series resistor connected to the third of the three windings, the voltage source being connected to apply an ac voltage across the third winding and the resistor in series therewith, said sensing means being operable to reverse the polarity of the voltage applied by the voltage source every time current through the third winding reaches a predetermined value, saturation of the core acting to increase the frequency of the ac voltage; and measuring means connected to measure the frequency of the voltage applied to the third winding and the series resistor to serve as a basis for detecting the relative magnitudes of currents in the two windings and relating the same to ground fault.

9. A device as claimed in claim 8 for detecting ground faults wherein the measuring means comprises a low pass filter electrically connected to receive input voltage signals from the voltage source and comparator means connected to receive the output from the low pass filter and set to give an indication when a ground current exceeds a predetermined value.

10. A device as claimed in claim 9 which is operable to prevent the ill effects on the sensing circuit of high ground currents, that comprises a small fixed inductor connected in series with the third winding and the voltage source and a high frequency detector circuit and comparator to sense when frequency is above a certain value to indicate heavy fault current.

11. A device as claimed in claim 8 in which the voltage source is electrically connected to apply a voltage pulse train in the form of positive and negative voltage pulses whose pulse lengths are $d_1$ and $d_2$, respectively, in which the duty cycle of the pulse train varies as a function of said saturation, and in which the duty cycle of the pulse train also serves as a basis for detecting the relative magnitudes of currents in the two windings.

12. A device as claimed in claim 8 in which the voltage source applies a voltage pulse train in the form of positive and negative voltage pulses whose pulse lengths are $d_1$ and $d_2$, respectively, and in which the ratio $d_1/d_2$ serves as a basis for detecting the relative magnitudes of currents in the two windings.

13. In a dc ground fault detector for connection to a dc system to detect any leakage or ground fault current in the system;

a high permeability magnetic core having a strong monlinear characteristic;

two windings wound about the magnetic core in a solenoidal configuration to form a coil and core combination which is a differential transformer, that is, in operation electric current flow in one winding of the two windings creates a magnetomotive force which is substantially equal and opposite to a magnetomotive force due to an equal electric current flow in the other winding of the two windings, any unbalance in the currents in the two windings acting to saturate the core;

sensing means to note any differential between the magnetomotive force generated by said one winding and the magnetomotive force generated by said other winding due to any unbalance in electric current flow in the two windings and operable to relate said differential to the leakage or ground fault current in the system, the high permeability and strong nonlinear characteristic of the magnetic core serving to exaggerate the differential caused by any unbalance in the electric current flow in the two windings, which sensing means comprises a third winding in the form of a low current tickler coil wound about the magnetic core and which further includes means to apply an alternating voltage across the third winding to create alterating electric current flow therein, which means to apply includes means operable to sense threshold values of the alternating electric current flow in the third winding and operable to reverse the applied voltage whenever the electric current flow exceeds a predetermined value, saturation of the magnetic core acting to increase the frequency of the alternating voltage;

and measuring means connected to receive as input thereto the alternating voltage and operable to relate the frequency thereof to leakage or ground fault.

14. A dc ground fault detector as claimed in claim 13 in which the magnetic core has a square hysteresis loop and is a toroidal core, in which the duty cycle of the voltage applied to the third winding is an indication of the relative levels of electric current flow in the two windings; and in which the measuring means measures the duty cycle and relates it to said relative levels.

15. A dc ground fault detector as claimed in claim 13 in which the two windings are adapted in an operating system to carry system load current and in which the measuring means is operable to measure the duty cycle of the alternating voltage applied to the third winding, which duty cycle, when about fifty percent, indicates that the currents in the two windings are equal.

16. A dc ground fault detector for connection to a dc system to detect any leakage or ground fault current in the system, that comprises:

a high permeability magnetic core having a strong nonlinear characteristic;

two windings wound about the magnetic core in a solenoidal configuration to form a coil and core combination which is a differential transformer, that is, in operation electric current flow in one winding of the two windings creates a magnetomotive force which is substantially equal and opposite to a magnetomotive force due to an equal electric current flow in the other winding of the two windings; and sensing means to note any differential between the magnetomotive force generated by said one winding and the magnetomotive force generated by said other winding and operable to relate said differential to the leakage or ground fault current in the system, which sensing means comprises a third winding wound about the magnetic core, a resistor and inductance in series therewith and a source of a variable-duty-cycle voltage square wave which is applied across the third winding, the resistor and inductance combination to effect electric current flow therein, said source comprising a comparator connected to sense the voltage across the resistor due to electric current flow therein and operable to reverse polarity of the square wave whenever a pre-set threshold value of current exists in the third winding, the frequency of the current in the third winding being affected by the state of saturation of the magnetic core, which state of saturation is affected by any said differential, so that the frequency of the square wave indicates the presence or absence of said differential, and means to relate said frequency to presence or absence of said differential, the presence of said differential indicating a ground fault.

17. A dc ground fault detector as claimed in claim 16 in which the duty cycle of the variable-duty-cycle voltage square wave changes as a result of said saturation and in which said means to relate comprises filter means to determine the dc value of the square wave and comparator means connected to compare the dc value to a reference set-point to provide an indication of existence of said differential.

18. A dc ground fault detector as claimed in claim 17 which further include light means energized by said comparator means in a pattern that indicates presence or absence of said differential.

19. A dc ground fault detector as claimed in claim 16 in which said means to relate includes means to measure the frequency of said square wave and operable to relate said frequency to the presence or absence of said differential.

20. A dc ground fault detector as claimed in claim 19 in which the means to measure comprises a phase locked loop comprising a voltage controlled oscillator and a phase sensitive detector.

21. In a ground fault detector for connection to a dc system to detect any leakage or ground fault current in the system, a high permeability magnetic core having a strong nonlinear characteristic;

two windings having an equal number of turns wound about the magnetic core in a solenoidal configuration to form a coil and core combination which is a differential transformer, that is, in operation electric current flow in one winding of the two windings creates a magnetomotive force which is substantially equal and opposite to a magnetomotive force due to an equal in magnitude electric current flow in the other winding of the two windings, said two windings, in an operating system, being serially connected with the load to-be-monitored being connected therebetween so that the two windings ordinarily carry load current, but, during fault, one winding conducts a current that differs from the current in the other winding, any differential between the currents being conducted by the two windings having an exaggerated effect on the magnetic core because of its strong non-linear characteristic, which results in a net dc flux therein and saturation thereof;

a tickler coil wound about the magnetic core to achieve magnetic coupling therewith;

sensing means which includes means to apply an alternating current to the tickler coil, which current changes polarity every time the current in the tickler coil reaches a threshold amplitude, the period of the alternating current being a function of said differential; and means connected to detect the alternating current and operable to note the period thereof and to relate said period to leakage or ground fault current in the system.

22. A ground fault detector as claimed in claim 21 that further includes an inductance and a resistor connected electrically in series with the tickler coil, the series combination of the tickler coil, the inductance and the resistor being driven by a voltage square wave generated by a comparator through an inverter, a voltage divider being connected between the output of the inverter and one end of the resistor, the other end of the resistor being connected as one input to the comparator, the other input thereto being from an intermediate point of the voltage divider, the combination of the comparator, the inverter, the tickler coil, the inductance, the resistor and the voltage divider forming an oscillator whose duty cycle is variable as a function of said differential.

23. A ground fault detector as defined by claim 13 in which the core has a square hysteresis loop and in which the sensing means includes an inductor connected electrically in series with the third winding and the series resistor in which said means to apply introduces a variable-duty-cycle square wave voltage across the serially connected third winding, resistor and inductance, both the frequency and the duty cycle of the square wave voltage varying as a function of said saturation, and measuring means connected to receive the variable-duty-cycle square wave voltage and operable to relate at least one of the frequency and the duty cycle to the presence or absence of said differential.

24. A ground fault detector as claimed in claim 23 that further includes an inductance connected electrically in series with the third winding and resistor, the series combination of the third winding, the inductance and the resistor being driven by the voltage square wave, and in which the means to apply comprises a comparator, an inverter, and a voltage divider connected between the output of the inverter and one end of the resistor, the other end of the resistor being connected as one input to the comparator, the inverter, the third winding, the inductance, the resistor and the voltage divider forming an oscillator whose duty cycle is variable as function of said differential.

* * * * *